(12) United States Patent
Kim (10) Patent No.: US 7,453,750 B2
(45) Date of Patent: Nov. 18, 2008

(54) FLASH MEMORY DEVICE WITH WORD LINE DISCHARGE UNIT AND DATA READ METHOD THEREOF

(75) Inventor: Ho-Jung Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 122 days.

(21) Appl. No.: 11/635,987

(22) Filed: Dec. 9, 2006

(65) Prior Publication Data

US 2008/0094927 A1    Apr. 24, 2008

(30) Foreign Application Priority Data

Oct. 19, 2006    (KR) ...................... 10-2006-0101951

(51) Int. Cl.
*G11C 7/00* (2006.01)
(52) U.S. Cl. ............................... 365/204; 365/189.011; 365/189.04
(58) Field of Classification Search ................ 365/204, 365/189.011, 189.04
See application file for complete search history.

(56) References Cited

U.S. PATENT DOCUMENTS

| | | | |
|---|---|---|---|
| 5,617,357 A * | 4/1997 | Haddad et al. | 365/185.27 |
| 6,717,861 B2 | 4/2004 | Jeong et al. | |
| 6,804,150 B2 | 10/2004 | Park et al. | |

FOREIGN PATENT DOCUMENTS

| | | |
|---|---|---|
| JP | 2003123491 | 4/2003 |
| JP | 2004213135 | 7/2004 |
| KR | 20020047770 | 6/2002 |
| KR | 20030021647 | 3/2003 |
| KR | 1020030054908 | 7/2003 |

OTHER PUBLICATIONS

English Abstract for Publication No. 1020020047770.
English Abstract for Publication No. 1020030021647.
English Abstract for Publication No. 2003-123491.
English Abstract for Publication No. 2004-213135.

* cited by examiner

*Primary Examiner*—Richard Elms
*Assistant Examiner*—Nam Nguyen
(74) *Attorney, Agent, or Firm*—F. Chau & Associates (57) ABSTRACT

Exemplary embodiments of the present invention provide a flash memory device which includes a memory cell array. A decoder circuit is connected to the memory cell array via a plurality of select lines and a plurality of word lines. The detector circuit supplies voltages for a read operation to the plurality of select lines and the plurality of word lines during the read operation. A word line discharge unit is connected to the memory cell array via the plurality of word lines. The word line discharge unit discharges a voltage level of a selected word line during the read operation.

18 Claims, 8 Drawing Sheets

Fig. 1

(PRIOR ART)

Fig. 2

(PRIOR ART)

Fig. 3

(PRIOR ART)

|           | Erase  | Program    | Read        |
|-----------|--------|------------|-------------|
| Sel.W/L   | 0      | Vpgm       | 0           |
| Unsel.W/L | Float  | Vpass      | $V_{read}$  |
| SSL       | Float  | Vcc        | $V_{read}$  |
| GSL       | Float  | 0          | $V_{read}$  |
| CSL       | Float  | 0          | 0           |
| "0" B/L   | Float  | 0(program) | 1.2         |
| "1" B/L   | Float  | 1(program) | <0.8        |
| Bulk      | Verase | 0          | 0           |

Fig. 4

(PRIOR ART)

$$N2 = \frac{N1}{2}$$

Fig. 10

Fig. 11

FLASH MEMORY DEVICE WITH WORD LINE DISCHARGE UNIT AND DATA READ METHOD THEREOF

CROSS-REFERENCE TO RELATED APPLICATIONS

This application claims priority under 35 U.S.C § 119 to Korean Patent Application 2006-101951 filed on Oct. 19, 2006, the entire contents of which are hereby incorporated by reference.

BACKGROUND OF THE INVENTION

1. Technical Field

The present disclosure relates to a flash memory device, and more particularly, to a flash memory device having a word line discharge unit and a data read method thereof.

2. Discussion of the Related Art

Figure 1:
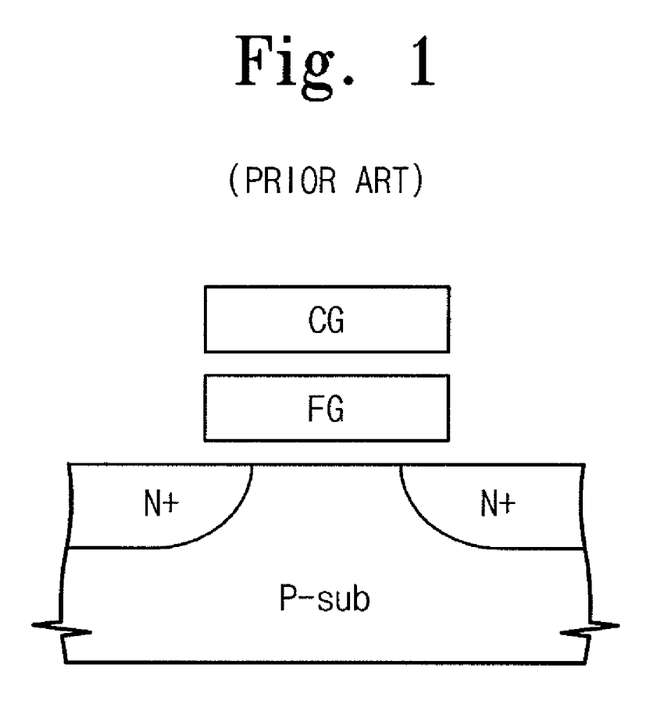
FIG. 1 is a cross-sectional diagram showing a memory cell structure of a conventional flash memory device.

FIG. 1 is a cross-sectional diagram showing a memory cell structure of a conventional flash memory device. A memory cell is a type of a transistor and is formed of a control gate CG, a floating gate FG, a substrate P-sub, a source, and a drain.

A threshold voltage of a memory cell may be determined by the amount of electrons that are trapped at a floating gate FG. In general, a memory cell operates in a binary mode and stores 1-bit of data. A 1-bit memory cell may have one of two states, e.g., 1 or 0 according to a threshold voltage distribution. Herein, it is assumed that a memory cell storing data 1 has an erase state and that a memory cell storing data 0 has a program state.

In recent years, in order to increase the density of data, a technique has been widely used which stores multi-bit data in a memory cell. In this case, a memory cell may have a number of possible program states (e.g., 4, 8, and 16 states) according to a threshold voltage distribution. The total number of program states may be spread over the same threshold voltage range as the conventional 1-bit memory cell. Therefore, memory cells with larger numbers of available program states have less of a read margin between each state.

Meanwhile, flash memory devices are increasingly becoming highly integrated and small. This causes decrease in a space/interval between adjacent word lines. Accordingly, there is a greater risk that capacitance coupling phenomenon is generated between adjacent word lines.

Figure 2:
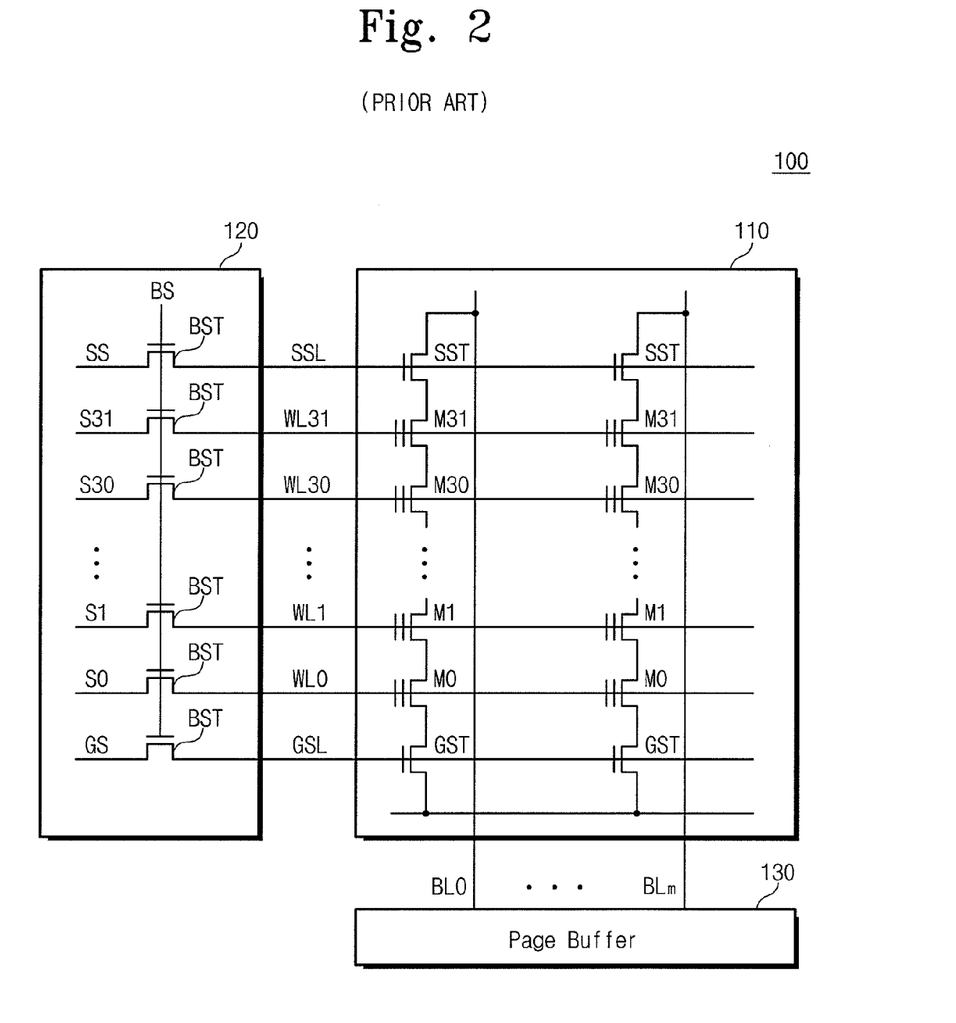
FIG. 2 is a block diagram showing a conventional NAND flash memory device.

FIG. 2 is a block diagram showing a conventional NAND flash memory device. A NAND flash memory device 100 includes a memory cell array 110, a block selector circuit 120, and a page buffer circuit 130.

The memory cell array may be formed of a plurality of memory blocks. For convenience of description, one memory block is illustrated in FIG. 2. A memory block is formed of a plurality of cell strings, each of which includes a string select transistor SST, a ground select transistor GST, and a plurality of memory cells M31 to M0 serially connected between the select transistors SST and GST.

The memory cell array 110 is connected to the block selector circuit 120 through a string select line SSL, a plurality of word lines WL0 to WL31, and a ground select line GSL. The memory cell array 110 is connected to the page buffer circuit 130 through a plurality of bit lines BL0 to BLm. The string select line SSL is connected commonly to string select transistors SST in respective cell strings. The word lines WL0 to WL31 are connected commonly to memory cells in respective rows. The ground select line GSL is connected commonly to ground select transistors GST in respective cell strings. The bit lines BL0 to BLm are connected to corresponding cell strings, respectively.

The block selector circuit 120 includes a plurality of block select transistors BST whose gates are connected to receive a block select signal BS. The block select transistors BST respond to the block select signal and provide the lines GSL, WL0-WL31, and SSL with corresponding select signals GS, S0-S31, and SS. The block select circuit 120 may be included in a row decoder circuit (refer to FIG. 5).

A row decoder (not shown in FIG. 2) selects a word line in response to a row address and supplies word line voltages to selected and unselected word lines according each mode of operation. For example, during a program operation, the row decoder supplies a program voltage to a selected word line and a pass voltage to unselected word lines. During a read operation, the row decoder supplies a ground voltage to a selected word line and a read voltage to unselected word lines. The select signals S0 to S31 may have at least one of a program voltage, a pass voltage, or a read voltage.

The page buffer circuit 130 supplies each of the bit lines BL0 to BLm with a program inhibit voltage or a program voltage according to program data during a program operation. In general, the program voltage has a ground voltage level and the program inhibit voltage has a power supply voltage level. The page buffer circuit 130 senses data from memory cells of a selected word line (referred to as a page) via the bit lines BL0 to BLm at a read/verify operation. The page buffer circuit 130 can be used to check whether memory cells are programmed cells or erased cells through a sense operation.

As a NAND flash memory device becomes highly integrated, however, the coupling effect between adjacent word lines becomes more serious. For example, a voltage of a word line, which is maintained at 0V at a read operation, may be increased higher than 0V due to a voltage of an adjacent word line. This will be more fully described below with reference to FIG. 4.

Figure 3:
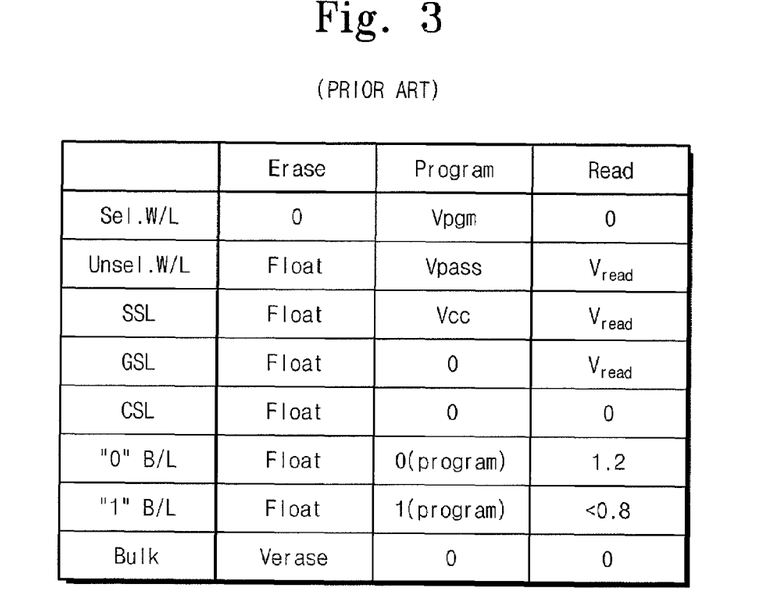
FIG. 3 is a table showing an exemplary bias condition of a NAND flash memory device illustrated in FIG. 2.

FIG. 3 is a table showing an exemplary bias condition of a NAND flash memory device illustrated in FIG. 2. FIG. 3 shows bias voltages of a selected word line, an unselected word line, a string select line SSL, a ground select line GSL, a common source line CSL, a bit line BL, and a substrate at erase, program, and read operations. For example, at a read operation, a voltage of 0V is applied to a selected word line (e.g., WL1 in FIG. 2), and a read voltage Vread is applied to unselected word lines (e.g., WL0, WL2-WL31).

Figure 4:
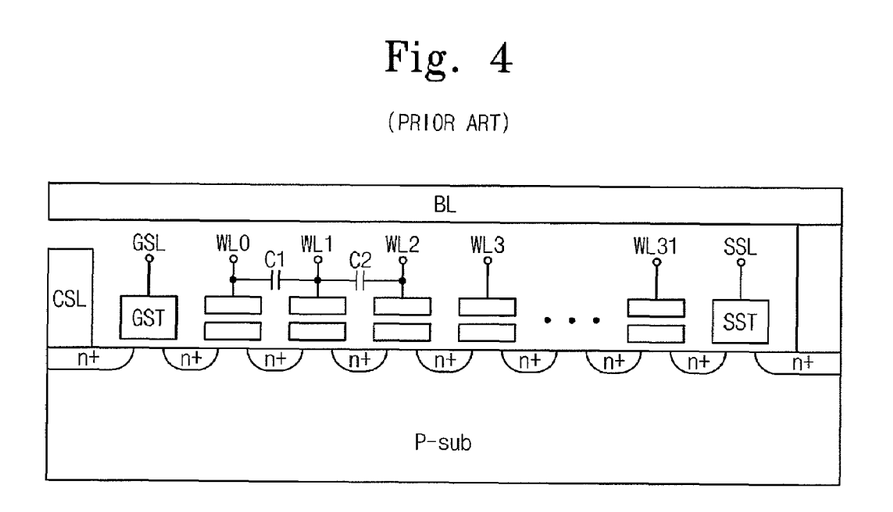
FIG. 4 is a cross-sectional diagram showing a cell string structure of a NAND flash memory device illustrated in FIG. 2.

FIG. 4 is a cross-sectional diagram showing a cell string structure of a NAND flash memory device illustrated in FIG. 2. At a read operation, a voltage of 0V is applied to a selected word line WL1, and a read voltage Vread is applied to unselected word lines WL0 and WL2-WL31. Under this bias condition, if a space between adjacent word lines becomes narrow, adjacent word lines (WL0 and WL1) and (WL1 and WL2) can experience capacitive coupling. Parasitic capacitance C1 existing between WL0 and WL1 and parasitic capacitance C2 existing between WL1 and WL2 are illustrated in FIG. 4.

In order to perform a read operation normally, a voltage applied to a selected word line, for example, WL1 is maintained at 0V. The voltage of the selected word line WL1 may be increased due to parasitic capacitance C1 and C2 illustrated in FIG. 4. If a voltage of the selected word line WL1 increases, it may be difficult or impossible to correctly read data stored in a selected page. The accurate reading of data uses a period of time when an increased voltage of the selected word line WL1 is stabilized. This causes increase in a read time of the NAND flash memory device 100.

SUMMARY OF THE INVENTION

Exemplary embodiments of the present invention are directed to a flash memory device which comprises a memory cell array. A decoder circuit is connected to the memory cell array via a plurality of select lines and a plurality of word lines. The decoder circuit supplies voltages for a read operation to the plurality of select lines and the plurality of word lines at the read operation. A word line discharge unit is connected to the memory cell array via the plurality of word lines. The word line discharge unit discharges a voltage level of a selected word line at the read operation.

Other exemplary embodiments of the present invention are directed to a data read method of a flash memory device. The flash memory device comprises first and second select transistors connected to first and second select lines and at least one memory cell connected between the first and second select transistors and to a word line. The data read method comprises supplying the first and second select lines and the at least one word line with voltages for a read operation and simultaneously discharging a voltage of the at least one word line.

BRIEF DESCRIPTION OF THE DRAWINGS

A more complete appreciation of the present disclosure and many of the attendant features thereof will be readily obtained as the same becomes better understood by reference to the following detailed description when considered in connection with the accompanying drawings, wherein.

DETAILED DESCRIPTION OF EXEMPLARY EMBODIMENTS

Exemplary embodiments of the present invention will be described more fully bellow with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 5:
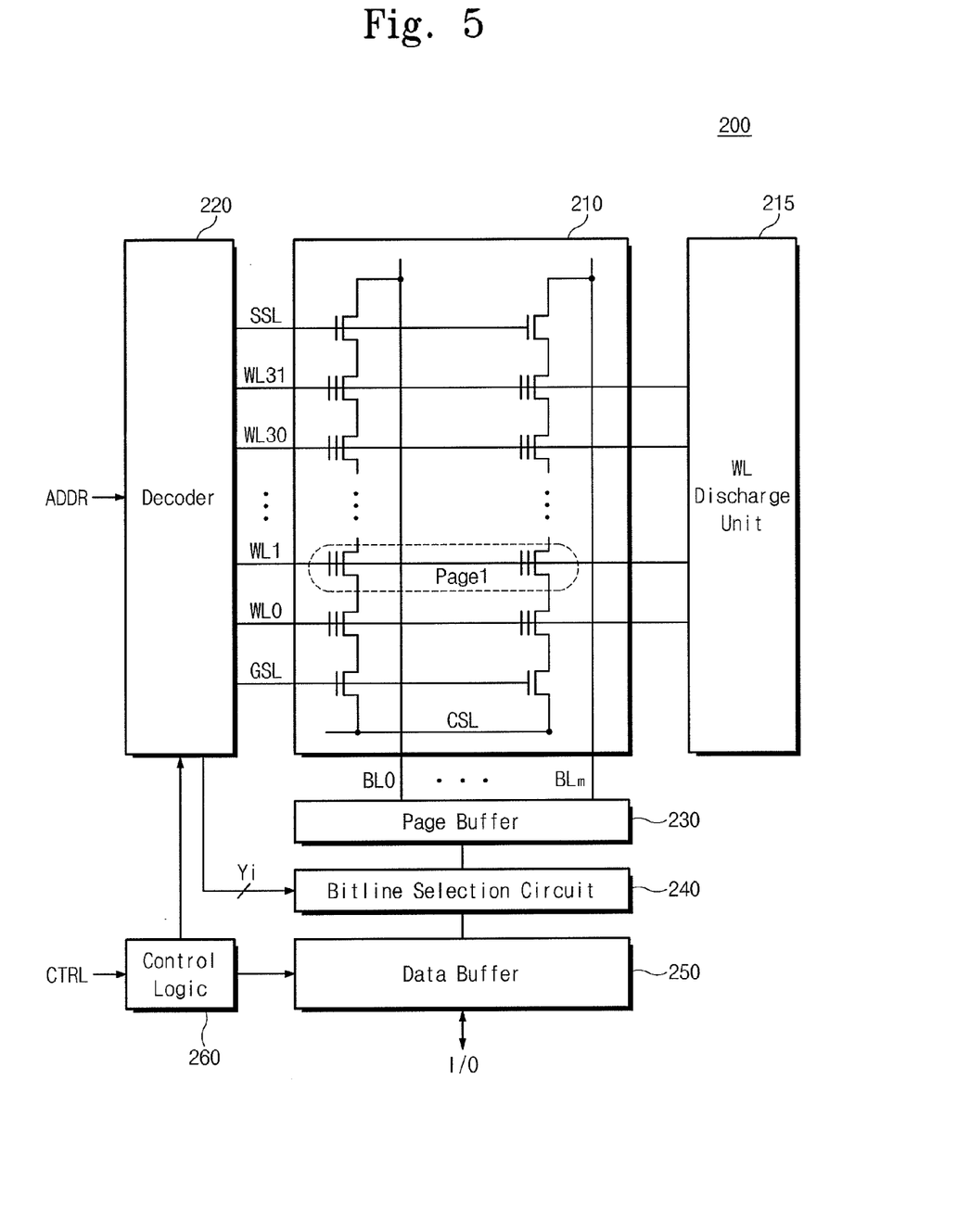
FIG. 5 is a block diagram showing a NAND flash memory device according to an exemplary embodiment of the present invention.

FIG. 5 is a block diagram showing a NAND flash memory device according to an exemplary embodiment of the present invention. Referring to FIG. 5, a NAND flash memory device 200 includes a memory cell array 210, a word line discharge unit 215, a decoder circuit 220, a page buffer circuit 230, a bit line selector circuit 240, a data buffer circuit 250, and a control logic unit 260.

The memory cell array 210 may be formed of a plurality of memory blocks. For convenience of description, one memory block is illustrated in FIG. 5. A memory block is comprised of a plurality of pages (e.g., 32 pages or 64 pages). Each page is formed of a plurality of memory cells (e.g., 512 B or 2 KB memory cells) that share a word line. In FIG. 5, one word line comprises a page. However, one word line may be comprised of a plurality of pages. In the NAND flash memory device, an erase operation is carried out in a block unit and a read/program operation is carried out in a page unit.

The word line discharge unit 215 is connected to the memory cell array 210 via the word lines WL0 to WL31. The word line discharge unit 215 is configured to reduce noise due to capacitive coupling between a selected word line (e.g., WL1) and adjacent word lines (e.g., WL0 and WL2) at a read operation. The word line discharge unit 215 prevents a voltage level of a selected word line from being increased due to capacitive coupling. For example, the word line discharge unit 215 is configured to set a selected word line to a ground voltage level (0V) at a read operation. This will be more fully described below.

The decoder circuit 220 is connected to the memory cell array 210 via the word lines WL0 to WL31 and is controlled by the control logic unit 260. The decoder circuit 220 receives an address ADDR from a memory controller (not shown), selects a word line and generates select signals Yi for selecting bit lines.

The page buffer circuit 230 is connected to the memory cell array 210 via the bit lines BL0 to BLm. The page buffer circuit 230 stores data loaded through the data buffer circuit 250. A page of data is loaded on the page buffer circuit 230 and is programmed at a selected page (e.g., page 1 in FIG. 5) at a program operation. Meanwhile, the page buffer circuit 230 reads and temporarily stores data from the selected page at the same time at a read operation. The stored data in the page buffer circuit 230 may be transferred to the memory controller (not shown) in synchronization with a read enable signal (nRE, not shown).

The bit line selector circuit 240 is a circuit for selecting bit lines in response to the select signals Yi. The data buffer 250 is an input/output buffer used for data transfer between the memory controller and the NAND flash memory device 200. The control logic unit 260 receives control signals from the memory controller (not shown) and is configured to control an entire operation of the flash memory device 200.

The NAND flash memory device 200 according to an exemplary embodiment of the present invention includes the word line discharge unit 215 which is configured to reduce noise due to capacitive coupling between a selected word line (e.g., WL1) and adjacent word lines (e.g., WL0 and WL2) at a read operation. For example, the word line discharge unit 215 prevents a voltage of a selected word line from being increased due to capacitive coupling.

Figure 6:
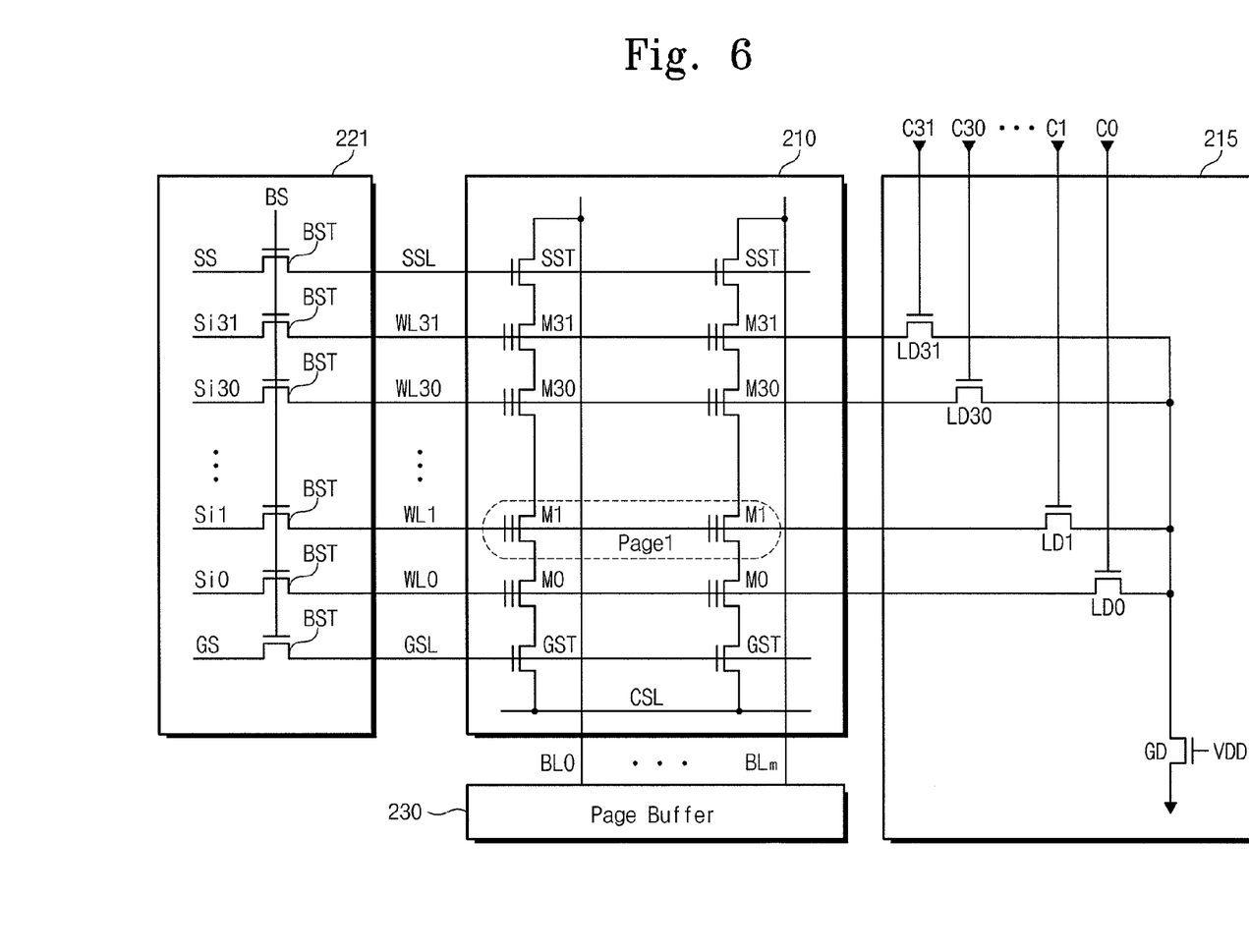
FIG. 6 is a circuit diagram showing a word line discharge unit illustrated in FIG. 5.

FIG. 6 is a circuit diagram showing the word line discharge unit 215 illustrated in FIG. 5. The word line discharge unit 215 reduces noise due to coupling between adjacent word lines at a read operation. Accordingly, a read speed of the flash memory device is improved and data is correctly read.

Referring to FIG. 6, the word line discharge unit 215 includes a plurality local discharge transistors LD0 to LD31 and a global discharge transistor GD. The local discharge transistors LD0 to LD31 are connected between corresponding word lines WL0 to WL31 and the global discharge transistor GD. For example, the local discharge transistor LD1 is connected between a corresponding word line WL1 and the global discharge transistor GD. The local discharge transistors LD0 to LD31 are turned on/off in response to corresponding local control signals C0 to C31, respectively. The global discharge transistor GD maintains a turn-on state in response to a power supply voltage VDD at a read operation.

Returning to FIG. 3, at a read operation of a NAND flash memory device, a decoder circuit 220 supplies a read voltage Vread to select lines GSL and SSL and unselected word lines, with a voltage of 0V being applied to a selected word line (e.g., WL1). At this time, a voltage of the selected word line WL1 may become higher than 0V due to coupling when the read voltage Vread is applied to word lines WL0 and WL2 adjacent to the selected word line WL1.

The present NAND flash memory device 200 is configured to turn on a local discharge transistor LD1 corresponding to the selected word line WL1, so as to maintain a voltage of the selected word line WL1 at 0V. For example, at the read operation, the NAND flash memory device 200 according to an exemplary embodiment of the present invention is configured to supply a voltage of 0V to the selected word line WL1 and to apply a local control signal C1 to the local discharge transistor LD1 corresponding to the selected word line WL1.

Accordingly, although a voltage of a selected word line is increased at a read operation, the increased voltage level of the selected word line is discharged to a ground voltage via a corresponding local discharge transistor to the selected word line and a global discharge transistor. The global discharge transistor GD is turned on at a read operation. Except for a local discharge transistor connected to the selected word line, remaining local discharge transistors are maintained at a turn-off state.

Figure 7:
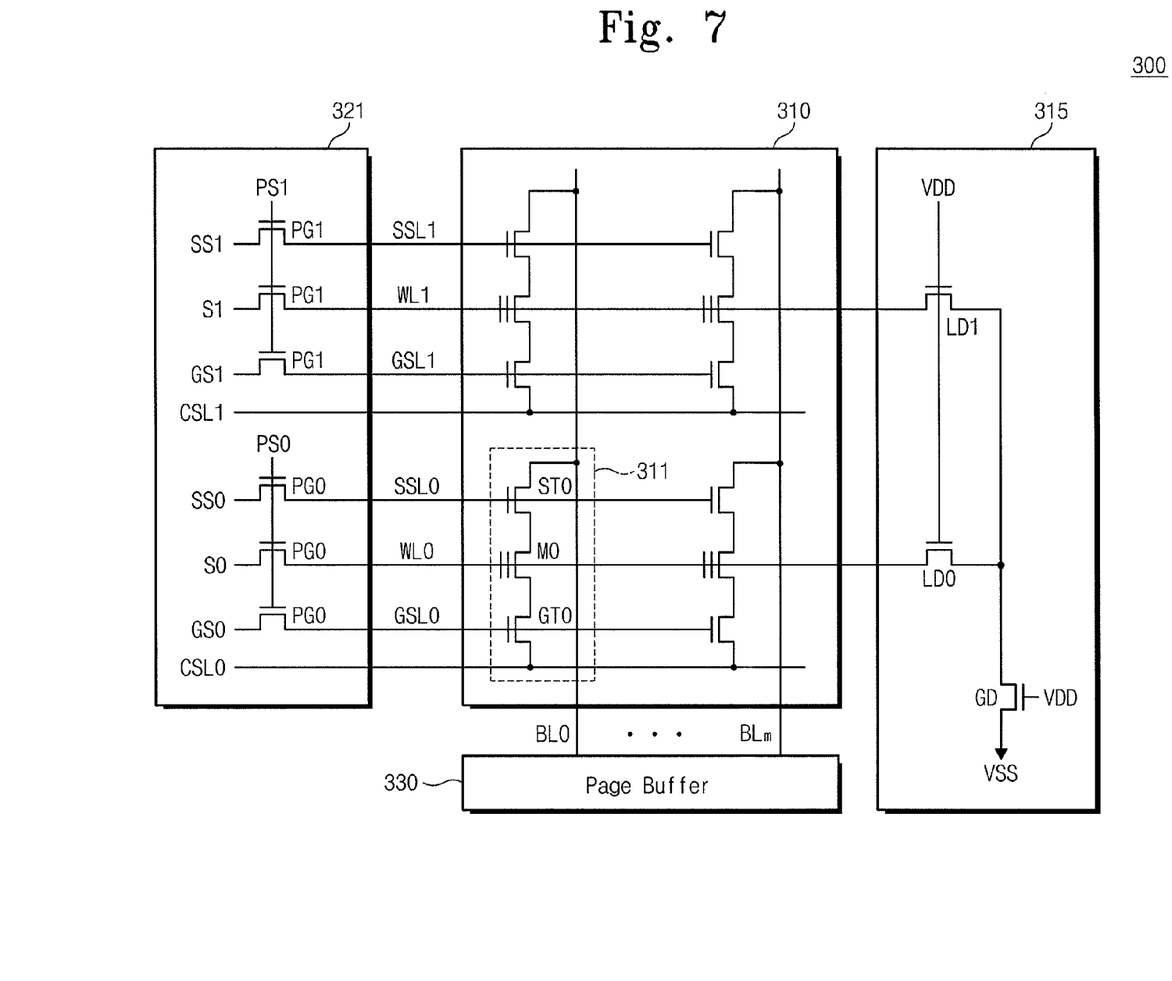
FIG. 7 is a circuit diagram showing a flash memory device according to another exemplary embodiment of the present invention.

FIG. 7 is a circuit diagram showing a flash memory device according to another exemplary embodiment of the present invention. FIG. 7 shows an execute in place (XIP) flash memory device 300. Referring to FIG. 7, the XIP flash memory device 300 includes a memory cell array 310, a word line discharge unit 315, a page selector circuit 321, and a page buffer circuit 330.

The memory cell array 310 is formed of a plurality of memory cell units. A memory cell unit 311 includes two select transistors ST0 and GT0 and a cell transistor M0. The select transistor ST0 corresponds to a string select transistor SST in FIG. 6, and the select transistor ST1 corresponds to a ground select transistor GST. Unlike a NAND flash memory device in FIG. 6, the cell transistor M0 of the XIP flash memory device 300 is formed of one cell transistor. A memory cell unit 311 is provided with select signals and a word line voltage via two select lines SSL0 and GSL0 and a word line WL0.

The page selector circuit 321 is connected to the memory cell array 310 via select lines SSLi and GSLi and word lines WLi. The page selector circuit 321 comprises a plurality of high-voltage switches PGi. In each memory cell unit, select lines SSLi and GSLi and a word line WLi are connected or disconnected by corresponding high-voltage switches PGi. The high-voltage switches PGi perform a switch operation according to a control of a decoder (not shown).

In the XIP flash memory device 300, at a read operation, select transistors (e.g., ST0 and GT0) are turned on by applying a read voltage Vread to corresponding select lines SSL0 and GSL0. At this time, a voltage of 0V is applied to a word line WL0. According to this bias condition, data may be judged by whether read current flows via a cell. However, as the XIP flash memory device becomes highly integrated, a voltage of a selected word line WL0 increases due to coupling with select lines SSL0 and GSL0 adjacent to the selected word line WL0.

For example, if a read voltage is applied to two signal lines SSL0 and GSL0 at a read operation, a selected word line WL0, which is maintained at 0V, may be increased quickly due to the coupling effect. Due to this noise, read error may be caused at the read operation. Alternatively, the time it takes to stabilize the increased voltage of the selected word line WL0 at 0V adds to the total time of the read operation.

Referring to FIG. 7, the XIP flash memory device 300 according to an exemplary embodiment of the present invention further comprises a word line discharge unit 315, which is formed of a plurality of local discharge transistors LD0 and LD1 and a global discharge transistor GD. The local discharge transistor LD0 is connected between a word line WL0 and the global discharge transistor GD, and the local discharge transistor LD1 is connected between a word line WL1 and the global discharge transistor GD.

At a read operation, if a page select signal PS0 is applied, a voltage of 0V is applied to a word line WL0, and a read voltage Vread is applied to a string select line SSL0 and a ground select line GSL0. Meanwhile, at the read operation, a power supply voltage VDD is applied to the local discharge transistors LD0 and LD1 of the word line discharge unit 315 to turn on the local discharge transistors LD0 and LD1. The global discharge transistor GD remains at a turn-on state except for program and erase states. For example, the word line discharge unit 315 discharges noise voltage that is generated at a selected word line WL0 via the local discharge transistor LD0 and the global discharge transistor GD at the read operation.

Herein, a plurality of local discharge transistors LD0 and LD1 are configured to be turned on at the same time using one metal line. But, like the NAND flash memory device illustrated in FIG. 6, a plurality of local discharge transistors LD0 and LD1 can be configured to be controlled individually using different metal lines.

Figure 8:
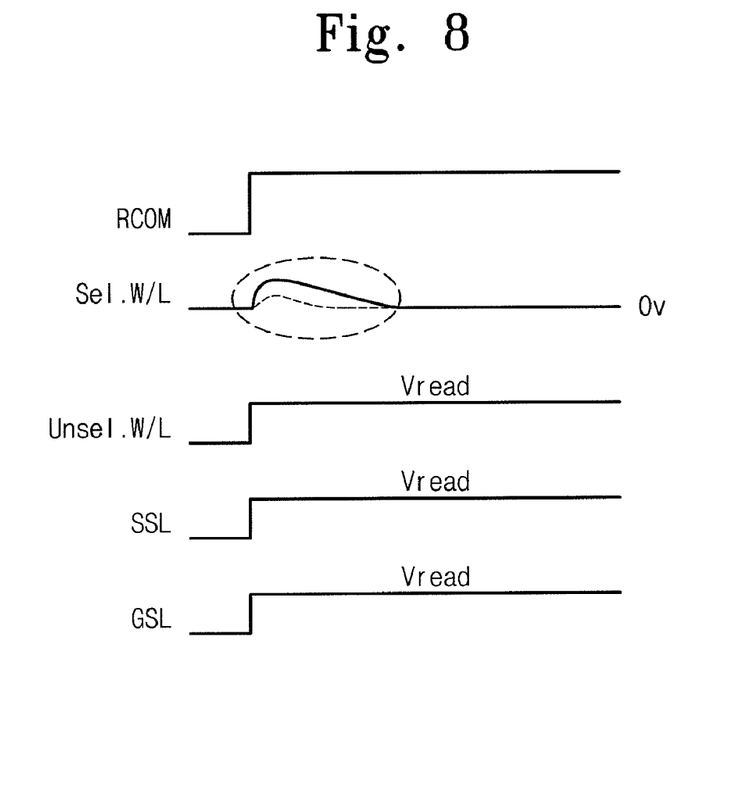
FIGS. 8 and 9 are diagrams showing voltages applied to word lines and select lines at a read operation.
Figure 9:
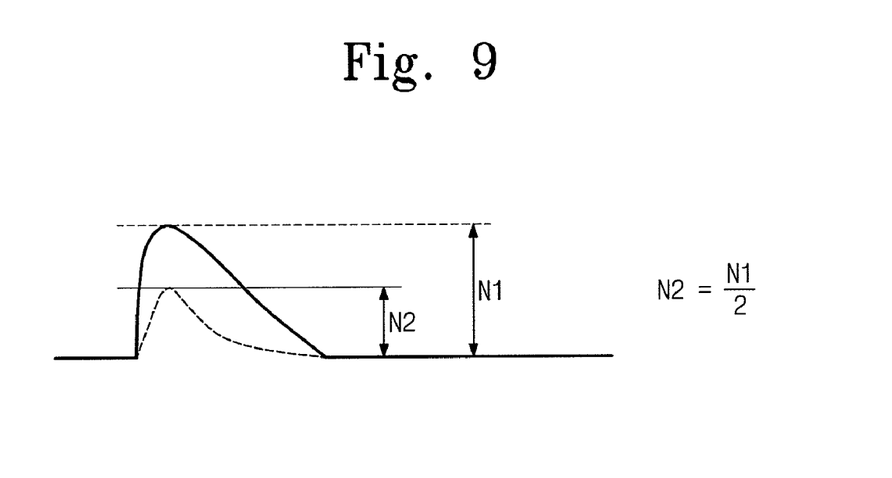

FIGS. 8 and 9 shows voltages applied to a word line and select lines at a read operation. Referring to FIG. 8, if a read command RCOM is enabled, a read voltage Vread is applied to unselected word lines, a string select line SSL, and a ground select line GSL. At this time, the selected word line, which is maintained at 0V, is quickly increased due to coupling with adjacent lines and then is gradually decreased.

A NAND flash memory device may perform a next operation when a voltage of a selected word line is stabilized. The time used to program after a read operation is called an active time. Generation of noise causes increase in the active time. If the active time is increased, an operating time of the NAND flash memory device is also increased. Furthermore, if a voltage of a selected word line is increased, an abnormal operation can be produced at a data read operation as described above.

As understood from FIG. 9, according to the present NAND flash memory device, the time taken to stabilize is reduced as compared with a conventional NAND flash memory device, and voltage increase is reduce by about 50%.

Figure 10:
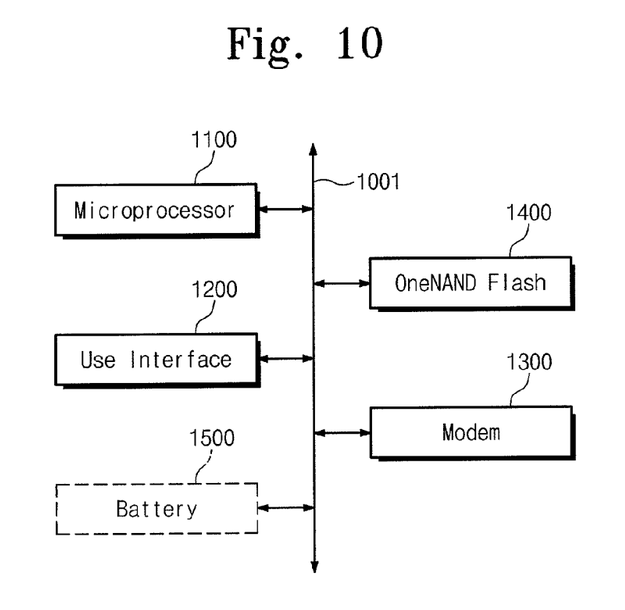
FIGS. 10 and 11 are diagrams showing a computing system including a flash memory device according to an exemplary embodiment of the present invention.

Flash memory devices are types of nonvolatile memories capable of keeping data stored therein even without power supply. With a rapid increase of using mobile apparatuses such as cellular phones, personal digital assistants (PDA), digital cameras, portable gaming consoles, and MP3 players, the flash memory devices are widely employed as code storage, as well as data storage. The flash memory devices may be also utilized in home applications such as high-definition TVs, digital versatile discs (DVDs), routers, and global positioning systems (GPSs). FIG. 10 is a block diagram showing a schematic computing system including the flash memory device of an exemplary embodiment of the present invention. The flash memory device of the present invention may be an OneNAND™ flash memory device where a flash memory, a buffer memory, control logic, etc. are formed on a single chip. The OneNAND™ flash memory device is configured to interface with an external device in a NOR interface manner.

The computing system according to an exemplary embodiment of the present invention comprises a microprocessor 1100, a use interface 1200, a modem 1300 such as a baseband chipset, and the flash memory device 1400. The flash memory device 1400 stores N-bit data (N is a positive integer) to be processed by the microprocessor 1100. Each of these components may be interconnected by an internal data bus 1001. If the computing system shown in FIG. 10 is a mobile apparatus, it is further provided with a battery 1500 for supplying an operating voltage of the system. Although not shown in FIG. 10, the computing system may be further equipped with an application chipset, a camera image processor (e.g., CMOS image sensor; CIS), a mobile DRAM, etc.

Figure 11:
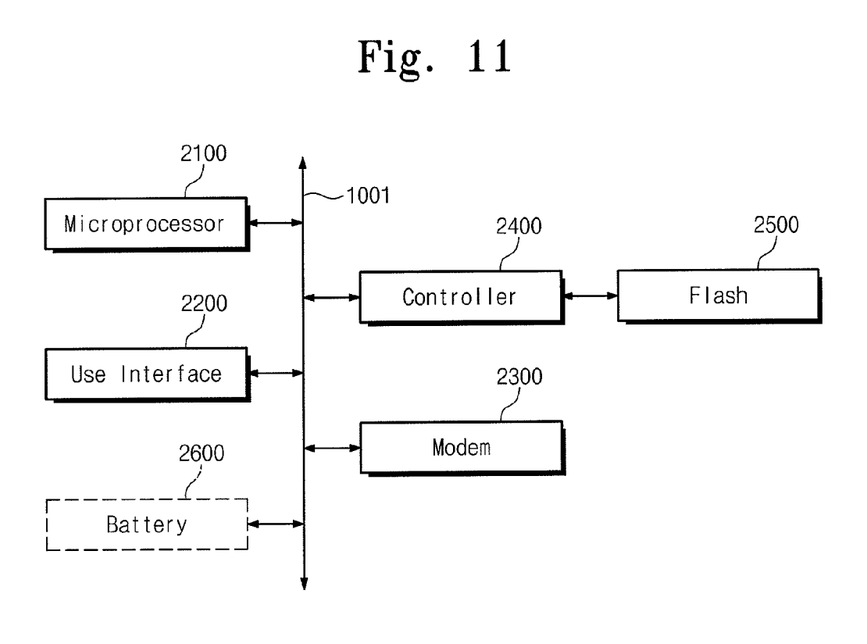

As illustrated in FIG. 11, a standard flash memory device can be used instead of the OneNAND™ flash memory device. In this case, a flash memory device 2500 in FIG. 11 may operate according to a memory controller 2400*t*. Except for this difference, a system in FIG. 11 is substantially identical to that in FIG. 10, also comprising a microprocessor 2100, a use interface 2200, and a modem 2300. Each of these components may be interconnected by an internal data bus 1001. If the computing system shown in FIG. 11 is a mobile apparatus, it is further provided with a battery 2600 for supplying an operating voltage of the system.

Although the present disclosure has been described in connection with the exemplary embodiment of the present invention illustrated in the accompanying drawings, it is not limited thereto. It will be apparent to those skilled in the art that various substitution, modifications and changes may be thereto without departing from the scope and spirit of the disclosure.

What is claimed is:

1. A flash memory device comprising:
  a memory cell array;
  a decoder circuit connected to the memory cell array via a plurality of select lines and a plurality of word lines, for supplying voltages for a read operation to the plurality of select lines and the plurality of word lines during the read operation; and
  a word line discharge unit connected to the memory cell array via the plurality of word lines, for discharging a voltage level of a selected word line, of the plurality of word lines, during the read operation.

2. The flash memory device of claim 1, wherein the memory cell array comprises a cell string structure with a plurality of memory cells connected in series between a string select transistor and a ground select transistor.

3. The flash memory device of claim 1, wherein the selected word line is supplied with a ground voltage and unselected word lines of the plurality of word lines are supplied with a read voltage.

4. The flash memory device of claim 1, wherein the word line discharge unit discharges a voltage of the selected word line to a ground voltage when a voltage of the selected word line is increased higher than the ground voltage due to capacitive coupling with at least one adjacent word line during the read operation.

5. The flash memory device of claim 1, wherein the word line discharge unit comprises:
  a plurality of local discharge transistors connected to the plurality of word lines, respectively; and
  a global discharge transistor connected between the local discharge transistors and a ground terminal.

6. The flash memory device of claim 5, wherein at the read operation, a local discharge transistor of the plurality of local discharge transistors that is connected to the selected word line is turned on and local discharge transistors, of the plurality of local discharge transistors that are connected to the unselected word lines are turned off.

7. The flash memory device of claim 5, wherein the global discharge transistor is maintained at a turn-on state during die read operation.

8. A flash memory device comprising:
  a memory cell array comprising an XIP flash structure where a memory cell is connected between a first select transistor and a second select transistor, the first and second select transistors being connected to first and second select lines, respectively, and the memory cell being connected to a word line; and
  a word line discharge unit connected to the memory cell array via the word line, for discharging a voltage level of the word line during a read operation.

9. The flash memory device of claim 8, wherein during the read operation, the word line is supplied with a ground voltage and the first and second select lines are supplied with a read voltage.

10. The flash memory device of claim 8, wherein the word line discharge unit discharges a voltage of the word line to a ground voltage when a voltage of the word line is increased higher than the ground voltage due to capacitive coupling with the first and second select lines during the read operation.

11. The flash memory device of claim 8, wherein the word line discharge unit comprises:
  a local discharge unit connected to the word line; and
  a global discharge unit connected between the local discharge unit and a ground terminal.

12. The flash memory device of claim 11, wherein the local discharge unit connected to the word line is turned on during the read operation.

13. The flash memory device of claim 11, wherein the global discharge unit is maintained at a turn-on state during the read operation.

14. A method for reading data from a flash memory device comprising first and second select transistors connected to first and second select lines, respectively, and at least one memory cell connected between the first and second select transistors and to a word line, the method comprising:
  supplying the first and second select lines and the word line with voltages for a read operation and simultaneously discharging a voltage of the word line.

15. The method of claim 14, wherein the flash memory device further comprises memory cells connected between the first and second select transistors comprising a cell string structure.

16. The method of claim 14, wherein the flash memory device comprises an XIP flash structure.

17. The method of claim 14, wherein the word line is discharged to a ground voltage during the read operation.

18. The method of claim 14, wherein during the read operation, the first and second select lines are supplied with a read voltage and the word line is supplied with a ground voltage.

* * * * *